United States Patent [19]
Yamaue et al.

[11] Patent Number: 5,734,452
[45] Date of Patent: Mar. 31, 1998

[54] TWO-TERMINAL NON-LINEAR RESISTIVE DEVICE AND A METHOD FOR PRODUCING THE SAME IN WHICH NICKEL OR IRON IS AN IMPURITY IN THE ZINC SULFIDE LAYER

[75] Inventors: Satoshi Yamaue; Kiyoshi Okano; Takao Nomura, all of Tenri; Kojiro Tsubota, Nara, all of Japan

[73] Assignee: Sharp Kabushiki Kaisha, Osaka, Japan

[21] Appl. No.: 469,912

[22] Filed: Jun. 6, 1995

[30] Foreign Application Priority Data

Sep. 26, 1994 [JP] Japan .................. 6-229947
Nov. 29, 1994 [JP] Japan .................. 6-294797

[51] Int. Cl.$^6$ ............................ G02F 1/135; G02F 1/136
[52] U.S. Cl. .................................................. 349/49
[58] Field of Search ..................... 359/58, 60; 349/49, 349/50, 41

[56] References Cited

U.S. PATENT DOCUMENTS

| | | | |
|---|---|---|---|
| 4,082,889 | 4/1978 | DiStefano | 428/328 |
| 4,097,776 | 6/1978 | Allinikov | 313/502 |
| 4,413,883 | 11/1983 | Baraff et al. | 359/58 |
| 4,730,903 | 3/1988 | Yamazaki et al. | 359/58 |
| 4,775,549 | 10/1988 | Ota et al. | 427/38 |
| 4,828,967 | 5/1989 | Mase et al. | 430/315 |
| 4,857,802 | 8/1989 | Fuyama et al. | 313/506 |
| 5,056,894 | 10/1991 | Kuijki | 359/58 |
| 5,396,354 | 3/1995 | Shimada et al. | 349/41 |
| 5,535,027 | 7/1996 | Kimura et al. | 359/58 |
| 5,552,910 | 9/1996 | Okano | 349/50 |
| 5,600,458 | 2/1997 | Okano et al. | 349/50 |

FOREIGN PATENT DOCUMENTS

| | | |
|---|---|---|
| 0377757 | 7/1990 | European Pat. Off. . |
| 0464810 A2 | 1/1992 | European Pat. Off. . |
| 49-75096 | 7/1974 | Japan . |
| 61-32673 | 7/1986 | Japan . |
| 61-32674 | 7/1986 | Japan . |
| 62-006221 | 1/1987 | Japan .................. 359/58 |
| 1-35352 | 7/1989 | Japan . |
| 1-270027 | 10/1989 | Japan . |
| 2-308227 | 12/1990 | Japan . |
| 4-73716 | 3/1992 | Japan . |
| 5-12688 | 2/1993 | Japan . |
| 5-72570 | 3/1993 | Japan . |
| 6-313899 | 11/1994 | Japan . |

OTHER PUBLICATIONS

IBM Technical Disclosure Bulletin, vol. 28, No. 9, Feb. 1986, New York, US, pp. 4185–4186, "LCD Including A Non–Linear Characteristic Layer".
Patent Abstracts of Japan, vol. 017, No. 402 (P–1580), 27 Jul. 1993, & JP–A–05 072567 (Toppan Printing Co. Ltd.) 26 Mar. 1993.
Patent Abstracts of Japan, vol. 011, No. 181 (P–585), 11 Jun. 1987 & JP–A–62 011828 (Seiko Epson Corp) 20 Jan. 1987.
Sutherland, "A Theory For Negative Resistance and Memory Effects in Thin Insulating Films and its Application to Au–ZnS–Au Devices", J. Phys. D. Appl. Phys. 1971, vol. 4, pp. 468–479.
Database WPI, Section Ch., Week 8124, Derwent Publications Ltd., London, GB; Class L03, AN 81–43253 & JP–A–56 046 584.
Lechner et al., "Liquid Crystal Matrix Displays", Proceedings of the IEEE, vol. 59, No. 11, pp. 1566–1579, Nov. 1971.

(List continued on next page.)

*Primary Examiner*—William L. Sikes
*Assistant Examiner*—Walter Malinowski
*Attorney, Agent, or Firm*—Nixon & Vanderhye P.C.

[57] ABSTRACT

A two-terminal non-linear resistive device including a first electrode, a second electrode, and a zinc sulfide layer interposed therebetween. The zinc sulfide layer contains at least one transition metal element as an impurity. The zinc sulfide layer is formed by sputtering using a sintered ZnS target including the transition metal element or a sintered ZnS target including the transition metal sulfide.

9 Claims, 15 Drawing Sheets

OTHER PUBLICATIONS

Castleberry, "Varistor–Controlled Liquid–Crystal Displays", IEEE Transactions on Electron Devices, vol. ED–26, No. 8, pp. 1123–1128, Aug. 1979.

Baraff et al, "The Optimization of Metal–Insulator–Metal Nonlinear Devices for Use in Multiplexed Liquid Crystal Displays", IEEE Transactions on Electron Devices, vol. ED–28, No. 6, pp. 736–739, Jun. 1981.

Murray et al, "Conduction in Thin Films of R.F. Reactively Sputtered Zinc Sulphide", Thin Solid Films, 22, 1974, pp. 37–44.

"Liquid Crystal Display", Sharp Corp., Liquid Crystal Display Division, p. 71, Sep. 1, 1991, with partial English translation.

Barov et al, Japanese Patent Publication No. 1–35352, published Jul. 25, 1989, with partial English translation.

S. Mitsui et al, SID 92 Digest, pp. 437–440, May 1992, "Late–News Paper: Bright Reflective Multicolor LCDs Addressed by a Si TFTs".

Fukuzawa et al, "Mechanism of Memory Phenomena in Evaporated Amorphous ZnS Films", Applied Physics, vol. 46, No. 7, pp. 690(3)–694(42), 1977.

Adams et al, "Non–Linear Blocking Layer for Matrix Addres Dispalys", Xerox Disclosure Journal, vol. 2, No. 3, p. 63, 1977.

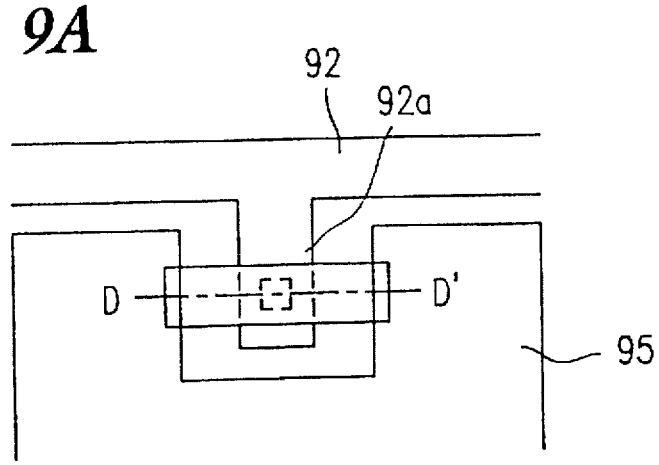
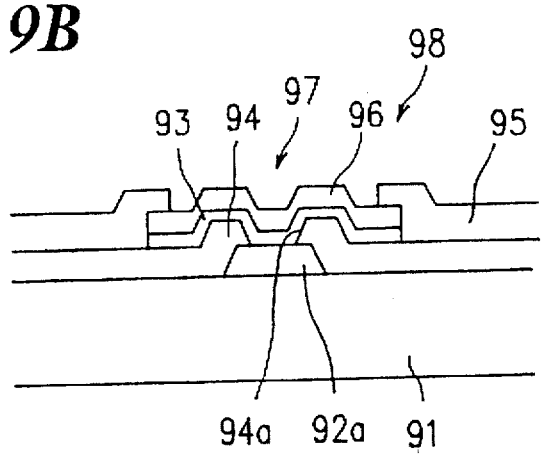

TWO-TERMINAL NON-LINEAR RESISTIVE DEVICE AND A METHOD FOR PRODUCING THE SAME IN WHICH NICKEL OR IRON IS AN IMPURITY IN THE ZINC SULFIDE LAYER

BACKGROUND OF THE INVENTION

1. Field of the Invention

The present invention relates to a two-terminal non-linear resistance device including zinc sulfide layer and a method for producing the same. More particularly, the present invention relates to a two-terminal non-linear device used as a switching element for a liquid crystal display apparatus.

2. Description of the Related Art

Portable office automation (OA) equipment such as personal computers has been considerably developed in recent years. In connection with down-sizing of OA equipment, much research and development has been done towards realizing a highly effective flat panel display used for such OA equipment. For example, a liquid crystal panel, an electron luminescent (EL) panel, a plasma panel, etc. have been proposed for such a flat panel display. Among these, liquid crystal displays (LCDs) are well commercialized and used for watches, pocket calculators, personal computers, television sets, etc.

As multiple information media have been developed, a display with high resolution, high contrast, multiple gray scale levels (a full-color display, a multi-color display), and reduced power consumption will be particularly important. Among various types of LCDs which are currently used, an active matrix type in which each pixel is provided with an active device (a switching element) is the most promising for satisfying the demands.

Typical active devices used in active matrix type displays are thin film transistors (TFTs) and thin film diodes (TFDs). A TFT requires a large number of masks to be used in photolithography during the production process, so the production yield is decreased and the production cost is disadvantageously increased. On the other hand, a TFD only requires about three masks to be used in the production process, so that the cost of the device is relatively low. Among such TFDs currently used, a metal-insulator-metal (MIM) device having a non-linear resistive layer of tantalum oxide ($Ta_2O_5$) is widely used. An LCD apparatus using such an MIM device is described in, for example, Japanese Patent Publication No. 61-32674.

FIG. 18A shows the general structure of one pixel in a conventional LCD apparatus using an MIM device. FIG. 18B shows the cross section taken along the line J–J' in FIG. 18A. The MIM device includes, on a glass substrate 101, a lower electrode 102 of tantalum (Ta), a non-linear resistive layer 103 of tantalum oxide ($Ta_2O_5$), and an upper electrode 104 of chromium (Cr) or the like, in this order from the substrate 101. The upper electrode 104 is connected to a pixel electrode 105 made of a transparent conductive layer of indium tin oxide (ITO) or the like, by overlapping an edge portion of the upper electrode 104 with the pixel electrode 105. The non-linear resistive layer 103 is usually formed by anodization of the lower electrode 102.

In the conventional MIM device, the nonlinear resistive layer of $Ta_2O_5$ can be formed uniformly by anodizing the lower electrode 102 of Ta. However, the conventional MIM device has the following problem. The current-to-voltage (I–V) characteristic as a two-terminal device is not sufficiently steep, i.e., the ON/OFF ratio is not high enough. In general, the I–V characteristic of the MIM device is expressed by the following Poole-Frenkel equations:

$$I = \alpha \exp(\beta \sqrt{V})$$

$$\alpha = (n\mu q/d)\exp(-\phi/kT)$$

$$\beta = (1/kT)\sqrt{q^3/\pi\epsilon_0'\epsilon d}$$

where q is the electric charge, n is the carrier density, μ is the mobility, φ is the depth of the trap, d is the thickness of the non-linear resistive layer, T is the temperature, k is Boltzmann's constant, $\epsilon_0$ is the vacuum dielectric constant, and ε is the relative dielectric constant.

As is apparent from the equations, the parameter β indicates the steepness of the I–V characteristic, i.e., the ON/OFF ratio of the switching element. In a case of $Ta_2O_5$, the value of β is relatively small because of a large value of the relative dielectric constant ε (23 to 25) In general, the value of β is about 3 and in an MIM device having a non-linear resistive layer of $Ta_2O_5$; $I_{20V}/I_{5V}$ is nearly equal to about $10^3$, where $I_{20V}$ and $I_{5V}$ are current values when an ON voltage of 20 V and an OFF voltage of 5 V are applied, respectively. It is difficult to achieve multiple gray scale levels by using an MIM device having such an ON/OFF ratio. In addition, the relatively large value of ε results in a relatively high capacitance ratio of the non-linear resistive device compared with that of the liquid crystal. This may undesirably reduce an effective voltage applied to the MIM device.

In order to avoid the above mentioned problems, the non-linear resistive layer may be made of a material having a small value of the relative dielectric constant ε. A candidate for such a material is zinc sulfide (hereinafter, referred to as ZnS) having a value ε in the range of 7 to 9 which is significantly smaller than that of $Ta_2O_5$. The value β of the ZnS layer is large enough to realize the ON/OFF ratio of $10^5$ which is higher than that of the $Ta_2O_5$ layer by 2 powers of ten. Therefore, an LCD apparatus using a non-linear resistive device having the ZnS non-resistive layer can provide a high quality display.

SUMMARY OF THE INVENTION

The two-terminal non-linear resistive device of this invention includes: a first electrode, a second electrode, and a zinc sulfide layer interposed between the first electrode and the second electrode. The zinc sulfide layer contains at least one transition metal element as an impurity.

According to one aspect of the invention, a two-terminal non-linear resistive device is used as a switching element in a display apparatus including a first substrate; a second substrate; a display medium interposed between the first and second substrates; a pixel electrode disposed on the first substrate for allowing the display medium to perform a display based on an applied voltage, the switching element being connected to the pixel electrode for applying the voltage for the display to the pixel electrode in accordance with a received driving signal; and a bus line for supplying the driving signal to the switching element. The two-terminal device comprising: a first electrode for receiving the driving signal; a zinc sulfide layer electrically connected to the first electrode; and a second electrode electrically connected to the zinc sulfide layer and electrically connected to the pixel electrode. The zinc sulfide layer includes at least one transition metal element as an impurity.

In one embodiment of the invention, the at least one transition metal element implanted into the ZnS layer is selected from a group consisting of Ni and Fe.

Preferably, the zinc sulfide layer includes at least one of 10 μg to 20 mg of Ni and 10 μg to 20 mg of Fe per 1 g of zinc sulfide.

In one embodiment of the invention, the display medium is a liquid crystal material.

The method of this invention is a method for producing a two-terminal non-linear resistive device including a first and a second electrodes and a zinc sulfide layer interposed therebetween, the zinc sulfide layer containing at least one transition metal element as an impurity. According to the invention, the zinc sulfide layer is formed on the first electrode by sputtering a sintered ZnS target which includes at least one transition metal sulfide which is made by sulfurizing said at least one transition metal element to be contained in the zinc sulfide layer.

In another aspect of the invention, the method for producing a two-terminal non-linear resistive device including a first and a second electrodes and a zinc sulfide layer interposed therebetween, the zinc sulfide layer containing at least one transition metal element as an impurity comprises the steps of: (a) forming the first electrode by patterning a first conductor on a substrate; (b) forming the zinc sulfide layer on the first electrode by sputtering a sintered ZnS target; and (c) forming a second electrode by patterning a second conductor on the zinc sulfide layer. The sintered ZnS target used in step (b) includes at least one transition metal sulfide which is made by sulfurizing said at least one transition metal element to be contained in the zinc sulfide layer.

In one embodiment of the invention, the sintered ZnS target includes at least one of Nickel sulfide and Iron sulfide.

Preferably, step (b) is performed so that the zinc sulfide layer includes at least one of 10 μg to 20 mg of Ni and 10 μg to 20 mg of Fe per 1 g of zinc sulfide.

The display apparatus of this invention includes: a first substrate; a second substrate; a display medium interposed between the first and second substrates; a pixel electrode disposed on the first substrate for allowing the display medium to perform a display based on an applied voltage; a switching element connected to the pixel electrode for applying the voltage for the display to the pixel electrode in accordance with a received driving signal; and a bus line for supplying the driving signal to the switching element. The two-terminal device comprises: a first electrode for receiving the driving signal; a zinc sulfide layer electrically connected to the first electrode; and a second electrode electrically connected to the zinc sulfide layer and electrically connected to the pixel electrode. The zinc sulfide layer includes at least one transition metal element as an impurity.

In one embodiment of the invention, the at least one transition metal element implanted into the ZnS layer is selected from a group consisting of Ni and Fe.

Preferably, the zinc sulfide layer includes at least one of 10 μg to 20 mg of Ni and 10 μg to 20 mg of Fe per 1 g of zinc sulfide.

In one embodiment of the invention, the display medium is a liquid crystal material.

In one aspect of the invention a method for using a two-terminal non-linear resistive device as a switching element in a display apparatus uses the two-terminal non-linear resistive device including: a first electrode; a second electrode; and a zinc sulfide layer interposed between the first electrode and the second electrode, said zinc sulfide layer including at least one transition metal element as an impurity, and the display apparatus includes: a first substrate; a second substrate; a display medium interposed between the first and second substrates; a pixel electrode disposed on the first substrate for allowing the display medium to perform a display based on an applied voltage, the switching element being connected to the pixel electrode for applying the voltage for the display to the pixel electrode in accordance with a received driving signal; and a bus line for supplying the driving signal to the switching element. In the method the first electrode is electrically connected to the bus line for receiving the driving signal, the zinc sulfide layer is electrically connected to the first electrode, and the second electrode is electrically connected to the zinc sulfide layer and to the pixel electrode.

In one embodiment of the invention, the at least one transition metal element implanted into the ZnS layer is selected from a group consisting of Ni and Fe.

Preferably, the zinc sulfide layer includes at least one of 10 μg to 20 mg of Ni and 10 μg to 20 mg of Fe per 1 g of zinc sulfide.

In one embodiment of the invention, the display medium is a liquid crystal material.

Thus, the invention described herein makes possible the advantages of (1) providing a two-terminal non-linear resistive device having an I-V characteristic which exhibits sufficient steepness and corresponding high ON/OFF ratio, and (2) providing a method for producing the two-terminal non-linear resistive device so as to reduce variation in the I-V characteristic of each device, whereby a display apparatus using the device provide perform a display with high quality.

These and other advantages of the present invention will become apparent to those skilled in the art upon reading and understanding the following detailed description with reference to the accompanying figures.

BRIEF DESCRIPTION OF THE DRAWINGS

FIG. 9A is a plan view showing a portion of a substrate with the ZnS device of the LCD apparatus in another example of the present invention.

FIG. 9B is a cross-sectional view taken along the line D–D' in FIG. 9A.

DESCRIPTION OF THE PREFERRED EMBODIMENTS

Hereinafter, the present invention will be described by way of illustrative examples with reference to the accompanying drawings.

A two-terminal non-linear resistive device according to the present invention includes a first electrode, a second electrode, and a zinc sulfide (ZnS) layer as a non-linear resistive layer interposed between the first electrode and the second electrode. The zinc sulfide layer contains at least one transition metal element as an impurity.

According to the present invention, the I–V characteristic of the two-terminal non-linear resistive device including the ZnS layer (hereinafter, referred to as a ZnS device) is controlled by the at least one transition metal element implanted into the ZnS layer. As is discussed in more detail below, the steepness (non-linearity) of the I–V characteristic and an ON-current of the ZnS device are adjusted to a display medium of the display apparatus by suitably selecting the type of transition metal element and its content in the ZnS layer.

Figure 1:
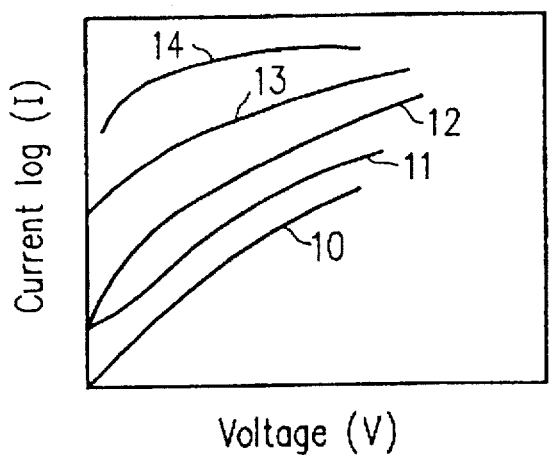
FIG. 1 is a diagram showing the I-V characteristic of a ZnS device in accordance with the present invention in the case where Ni is implanted into the ZnS layer.

FIG. 1 shows the I–V characteristic of the ZnS device of the present invention in the case where Ni is implanted into the ZnS layer. In FIG. 1, a horizontal axis of the diagram represents a voltage V applied to the ZnS device and a longitudinal axis of the diagram represents a current I flowing through the ZnS device. A scale of the longitudinal axis is a logarithmic scale. Curve 10 shows the I–V characteristic of the ZnS device including a pure ZnS layer, and curves 11–14 show that including a ZnS layer containing Ni as an impurity. The curves 11–14 indicate the I–V characteristic of the ZnS device which includes the ZnS layer containing 10 µg, 1 mg, 10 mg, and 50 mg of Ni per 1 g of ZnS, respectively.

As is understood from FIG. 1, the I–V characteristic can be changed depending on the dosage of Ni implanted into the ZnS layer. The curves 10–14 represent the increase in ON-current in accordance with the increase in the amount of Ni. However, when the amount of Ni exceeds 50 mg per 1 of ZnS, the steepness of the I–V characteristic is reduced to lose the non-linear resistive effect for a switching element.

Figure 2:
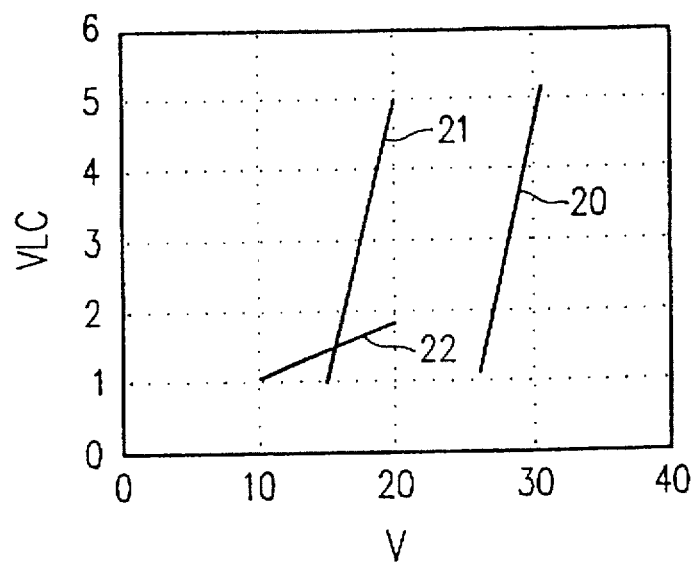
FIG. 2 is a diagram showing the relationship between a driving voltage V applied to the ZnS device and a voltage VLC applied to a display medium of a display apparatus using the ZnS device.

FIG. 2 shows the relationship between a driving voltage V applied to the ZnS device and a voltage VLC applied to a display medium of a display apparatus using the ZnS device. Curves 20–22 indicate the ZnS device having the ZnS layer containing no impurity, 1 mg of and 50 mg of Ni per 1 g of ZnS, respectively.

In a case where the pure ZnS layer is used, as is understood from the curve 20, a driving voltage V as large as 30 volts or more is required in order to apply 5 volts of the voltage VLC to the display medium. However, in order to avoid damaging the ZnS device the driving voltage should be limited to less than about 28 volts. Thus, the voltage applied to the display medium is about 3 volts which is not sufficient to provide a high quality display.

In a case where the ZnS layer containing 1 mg of Ni per 1 g of ZnS is used, as is understood from the curve 21, a driving voltage required for applying 5 volts of the voltage VLC to the display medium is about 20 volts. Therefore, the ZnS device using the ZnS later containing Ni can provide a better display than that using the pure ZnS layer. On the other hand, in a case where the ZnS layer contains 50 mg of Ni per 1 g of ZnS, the I–V characteristic curve 22 loses the steepness and a voltage applied to the display medium is not sufficient.

Figure 3:
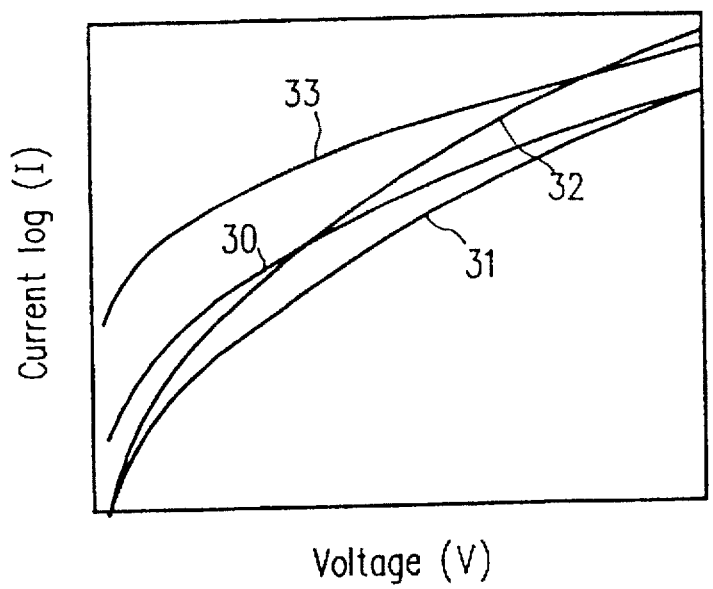
FIG. 3 is a diagram showing the I-V characteristic of the ZnS device of the present invention in the case where Fe is implanted into the ZnS layer.

FIG. 3 shows the I–V characteristic of the ZnS device of the present invention in the case where Fe is implanted into the ZnS layer. In FIG. 3, as in the case of FIG. 1, a horizontal axis of the diagram represents a voltage V applied to the ZnS device and a longitudinal axis of the diagram represents a current I flowing through the ZnS device. A scale of the longitudinal axis is a logarithmic scale. In FIG. 3, curve 30 shows the I–V characteristic of the ZnS device including a pure ZnS layer, and curves 31–33 show that including a ZnS layer containing Fe as an impurity. The curves 31–33 indicate the I–V characteristic of the ZnS device including the ZnS layer containing 100 µg, 20 mg, and 50 mg of Fe per 1 g of ZnS, respectively.

As is understood from FIG. 3, the I–V characteristic can be changed depending on the dosage of Fe implanted into the ZnS layer. The curves 30–33 represent the increase in the steepness of the I–V characteristic (i.e. the non-linearity of the ZnS device) in accordance with the increase in the amount of Fe. However, when the amount of Fe exceeds 50 mg per 1 g of ZnS, the steepness of the I–V characteristic is vanished. Thus, there is an optimum Fe content range of the ZnS layer.

Figure 4:
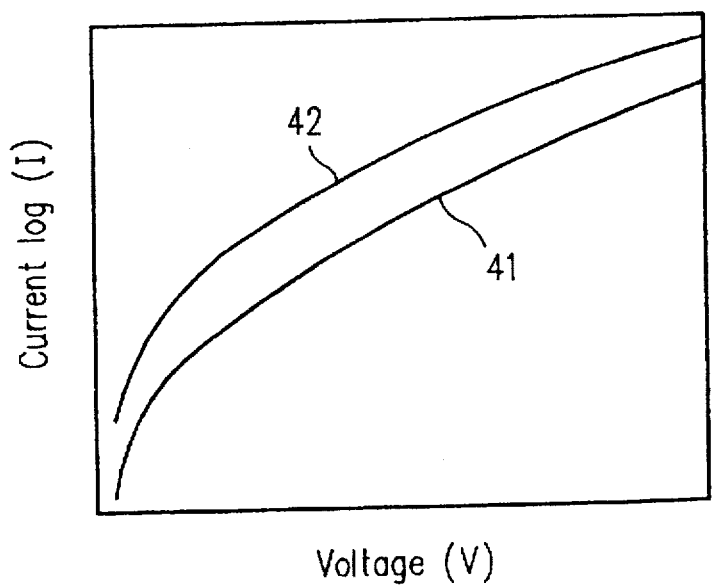
FIG. 4 is a diagram showing the I-V characteristic of the ZnS device of the present invention in the case where Fe and Ni are implanted into the ZnS layer.

The ON-current can be increased by adding Ni to the ZnS layer containing Fe. FIG. 4 shows the I–V characteristic of the ZnS device of the present invention in the case where Fe and Ni are implanted into the ZnS layer. In FIG. 4, curve 41 shows the I–V characteristic of the ZnS device including the ZnS layer containing 1 mg of Fe and 100 µg of Ni per 1 g of ZnS, and curve 42 shows that including the ZnS layer containing 1 mg of Fe and 1 mg of Ni per 1 g of ZnS. As shown in FIG. 4, I–V characteristic can be changed depending on the dosage of Fe and Ni implanted into the ZnS layer.

As described above, an implantation of 10 µg to 20 mg of Ni per 1 g of ZnS increases the ON-current in accordance with the amount of Ni. Similarly, implanting of 10 µg to 20 mg of Fe per 1 g of ZnS increases the steepness of the I–V characteristic. By implanting Fe and Ni and controlling the content ratio thereof, the switching characteristic (e.g. non-linearity and ON-current) of the ZnS device is suitably adjusted to the characteristic of the display medium of the display apparatus. This makes it possible to realize a display with high quality.

Hereinafter, a display apparatus using the ZnS device of the present invention will be described.

Example 1

In Example 1, a reflection type White-Taylor guest-host LCD apparatus using The ZnS device is described. In this example, a non-linear resistive layer is zinc sulfide layer including nickel as an impurity.

Figure 5A:
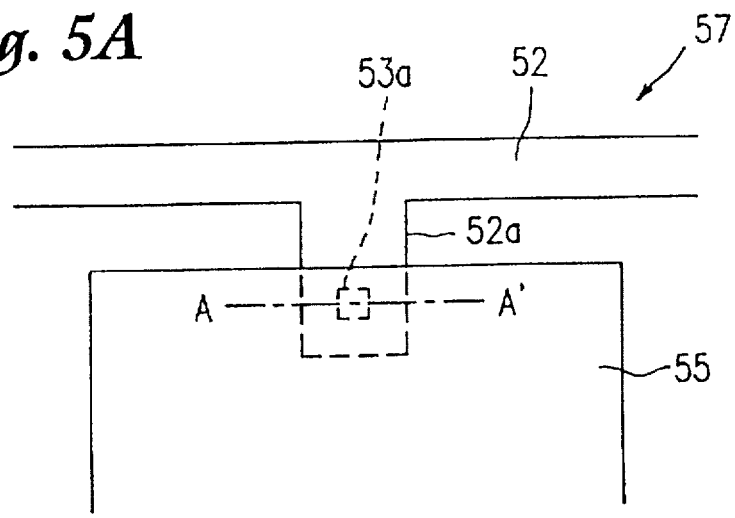
FIG. 5A is a plan view showing a portion of a substrate with the ZnS device of the LCD apparatus in one example of the present invention.
Figure 5B:
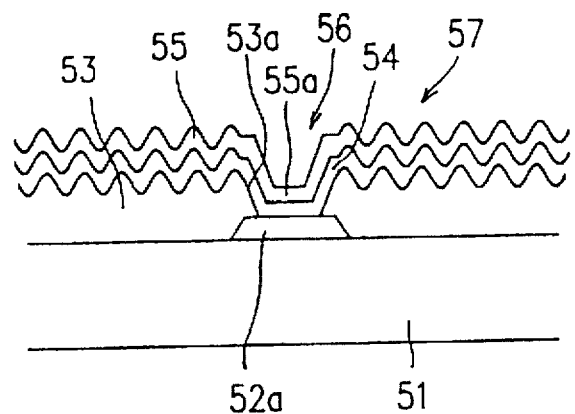
FIG. 5B is a cross-sectional view taken along the line A-A' in FIG. 5B.

FIG. 5A is a plan view showing a portion of a substrate 57 with the ZnS device of the LCD apparatus in this example of the present invention. FIG. 5B shows the cross section taken along the line A–A' in FIG. 5A. The ZnS device 56 includes, on a glass substrate 51, a first electrode 52a (a portion of a scanning line 52) of tantalum (Ta), a ZnS layer (non-linear resistive layer) 54, and a second electrode 55a which is a portion of a pixel electrode 55 of aluminum (Al). Preferably, a thickness of the ZnS layer is 100 nm and the Ni content of the ZnS layer is 5 mg per 1 g of ZnS.

As shown in FIGS. 5A and 5B, a conductive layer of Ta is formed on the glass substrate 51 with a thickness of 200 nm by sputtering, and the scanning line 52 is formed by patterning the conductive layer on the glass substrate 51. Next, an insulator layer 53 is formed on the glass substrate 51. The insulating layer is formed as follows. By spinner coating, an acrylic acid positive-type photosensitive resin is applied on the entire surface of the glass substrate 51. The photosensitive resin has a thickness of about 1.4 µm. Using a photosensitive resin can make patterning processes simple. After the exposure using a photomask, development is performed using a prescribed developer, so as to form the insulator layer 53 having through-hole 53a. The throughhole 53a is used for connecting the ZnS layer 54 and the second electrode 52a.

Next, the surface of the insulator layer 53 is corrugated by a reactive ion etching (RIE) process. The corrugated surface has about 700 nm of unevenness which improves the reflection characteristic of the pixel electrode.

Next, the ZnS layer 54 is formed on the scanning line 52 and the insulator layer 53 by sputtering using a sintered ZnS target including Ni. The ZnS layer is formed with a thickness of about 100 nm. A quantitative analysis using a flameless atomic absorption spectrometry found that the Ni content of the ZnS layer is 5 mg per 1 g of ZnS. Next, an Al layer is deposited on the substrate 57 by sputtering so as to have a thickness of about 200 nm, and then a photolithography process and an etching process are performed so as to form the pixel electrode 55. The portion 55a of the pixel electrode 55 corresponding to the through-hole 53a serves as the second electrode of the ZnS device 56.

Figure 6:
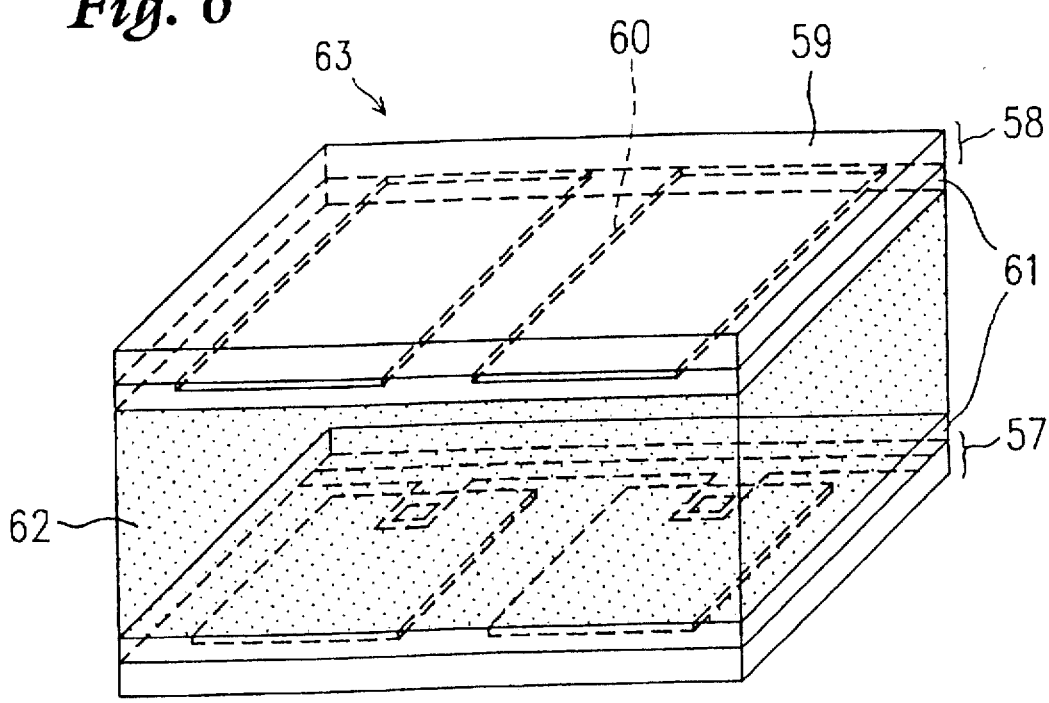
FIG. 6 is a perspective view showing a part of the LCD apparatus of one example of the present invention.

FIG. 6 is a perspective view showing a part of the LCD apparatus 63 in Example 1 of the invention. As shown in FIG. 6, a counter substrate 58 is opposed to the substrate 57 and a display medium layer 62 such as liquid crystal material is interposed between the substrates 57 and 58.

The counter substrate 58 is produced in the following manner. As shown in FIG. 6, a transparent conductive layer of ITO is formed on a glass substrate 59 by sputtering. A thickness of the ITO layer is about 200 nm. The ITO layer is then patterned into counter electrodes (data electrodes) 60 having a stripe shape by using photo-lithography and etching processes. The etching process may use hydrogen bromide acid.

Next, alignment layers 61 are formed on the substrate 57 and the counter substrate 58. The alignment layers 61 may be formed of polyimide (PI) with a rubbing treatment performed on the surfaces of both of the polyimide layers.

The substrate 57 and the counter substrate 58 are disposed so as to face each other with a predetermined spacing, and a White-Taylor guest-host type liquid crystal material is injected between the substrates 57 and 58 so as to form a display medium layer 62. The White-Taylor guest-host type liquid crystal material requires a relatively high driving voltage. By using the ZnS device of the present invention, the display apparatus using the White-Taylor guest-host type liquid crystal material can provide a display exhibiting high quality.

Example 2

In Example 2, a reflection type White-Taylor guest-host LCD apparatus using the ZnS device is described. In this example, the ZnS layer of the ZnS device includes iron as an impurity.

Figure 7A:
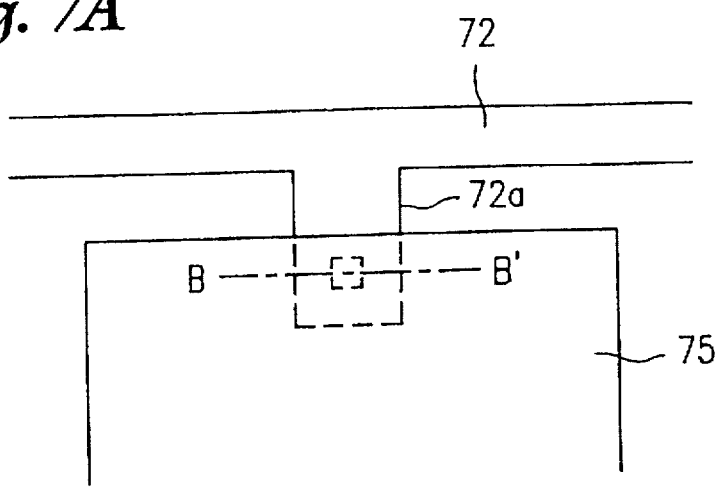
FIG. 7A is a plan view showing a portion of a substrate with the ZnS device of the LCD apparatus in another example of the present invention.
Figure 7B:
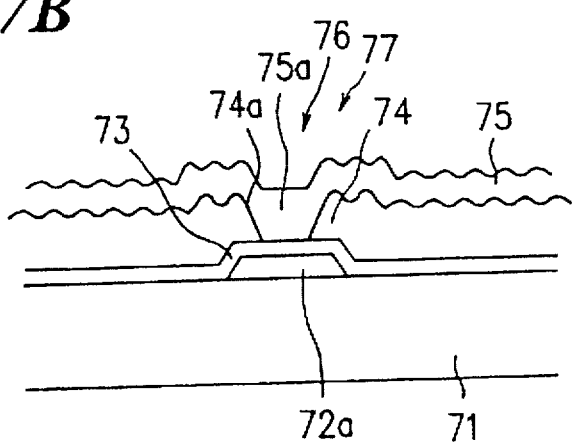
FIG. 7B is a cross-sectional view taken along the line B-B' in FIG. 7A.

FIG. 7A shows a plan view showing a portion of a substrate 77 with the ZnS device of the LCD apparatus in the second example of the present invention. FIG. 7B shows the cross section taken along the line B–B' in FIG. 7A. The ZnS device 76 includes, on a glass substrate 71, a first electrode 72a (forming a portion of a scanning line 72) of tantalum (Ta), a ZnS layer (non-linear resistive layer) 73, and a second electrode 75a which is a portion of a pixel electrode 75 of aluminum (Al). Preferably, a thickness of the ZnS layer is 80 nm and the Fe content of the ZnS layer is 1 mg per 1 g of ZnS.

As shown in FIGS. 7A and 7B, a conductive layer of Ta is formed on the glass substrate 71 with a thickness of 200 nm by sputtering, and the scanning line 72 is formed by patterning the conductive layer on the glass substrate 71. Next, the ZnS layer 73 is formed on the glass substrate 71 by sputtering using a sintered ZnS target including Fe, so as to cover the scanning line 72. The ZnS layer 73 is formed with a thickness of 80 nm. A quantitative analysis using a flameless atomic absorption spectrometry confirms that the Fe content of the ZnS layer 73 is 1 mg per 1 g of ZnS.

Next, an insulator layer 74 is formed on the ZnS layer 73. In this example, an acrylic acid positive-type photosensitive resin is used to form the insulating layer 74. Using a photosensitive resin can make patterning processes simple. By spinner coating, the photosensitive resin is applied on the entire surface of the ZnS layer 73 so as to have a thickness of about 1.4 μm. After exposure using a photomask, development is performed using a prescribed developer, so as to form the insulator layer 74 having a through-hole 74a. The through-hole 74a is used for connecting the ZnS layer 73 and the second electrode 75a. Thereafter, the surface of the insulator layer 74 is corrugated by RIE process.

Next, an Al layer is deposited on the substrate 77 by sputtering so as to have a thickness of about 200 nm. Then, photo-lithography and etching processes are performed so as to form the pixel electrode 75. The portion 75 of the pixel electrode 75 corresponding to the through-hole 74a serves as the second electrode of the ZnS device 76.

Fabrication processes for a counter substrate and a liquid crystal layer are the same as the first example.

Example 3

In Example 3, an LCD apparatus using a pair of the ZnS devices which are connected in series to form a back-to-back structure is described.

Figure 8A:
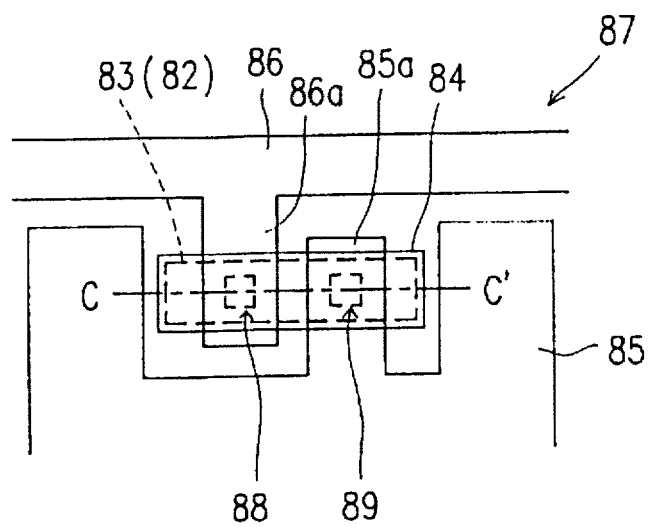
FIG. 8A is a plan view showing a portion of a substrate with the ZnS device of the LCD apparatus in another example of the present invention.
Figure 8B:
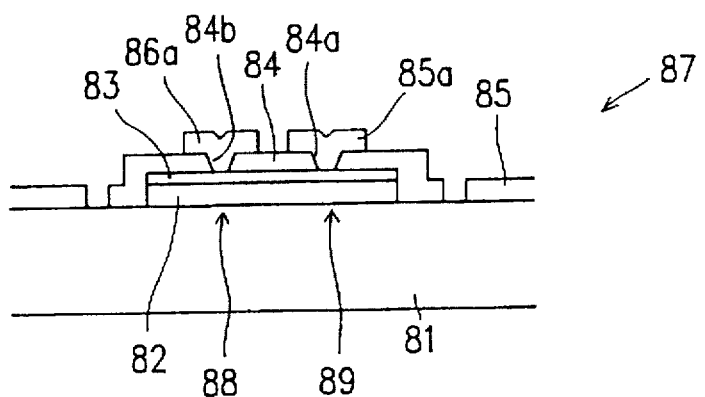
FIG. 8B is a cross-sectional view taken along the line C–C' in FIG. 8A.

FIG. 8A is a plan view showing a portion of a substrate 87 with the ZnS devices in the LCD apparatus in Example 3. FIG. 8B shows a cross section taken along the line C–C' in FIG. 8A.

As shown in FIGS. 8A and 8B, in the substrate 87, a pixel electrode 85 formed of Al, a scanning line 86 formed of Al, and a pair of the ZnS devices are formed on a glass substrate 81. The pixel electrode 85 includes a protrusion 85a extending toward the scanning line 86, and the scanning line 86 includes a protrusion 86a extending toward the pixel electrode 85. Under the protrusions 85a and 86a, an island-like electrode 82 made of Ta is formed on the glass substrate 81. A ZnS layer 83 containing Ni is formed on the island-like electrode 82. An insulator layer 84 is formed so as to cover the entire ZnS layer 83. The insulator layer 84 has throughholes 84a and 84b. The protrusion 85a of the pixel electrode 85 is connected to the ZnS layer 83 via the through-hole 84a, and the protrusion 86a of the scanning line 86 is connected to the ZnS layer 83 via the through-hole 84b.

The LCD apparatus having the above construction includes a first ZnS device 88 and a second ZnS device 89. The first ZnS device 88 has an MSM (Metal-Semiconductor-Metal) three-layer structure in the through-hole 84b. The MSM structure of the first ZnS device 88 includes the protrusion 86a of the scanning line 86, the ZnS layer 83, and the island-like electrode 82. The second ZnS device 89 also has an MSM three-layer structure in the through-hole 84a including the island-like electrode 82, the ZnS layer 83, and the protrusion 85a of the pixel electrode 85. The first and second ZnS devices 88 and 89 are coupled in series at opposite polarities, so as to form a back-to-back structure.

Next, the production process of the LCD apparatus having the above-described construction will be described with reference to FIGS. 8A and 8B.

First, a conductive layer of Ta for making up the island-like electrode 82 is formed on the glass substrate 81 by sputtering so as to have a thickness of about 300 nm. Next, the ZnS layer 83 is formed on the glass substrate 81 by sputtering using a sintered ZnS target including Ni, so as to cover the electrode 82. The ZnS layer 83 is formed with a thickness of 80 nm and containing 500 μg of Ni per 1 g of ZnS. The ZnS layer 83 and the electrode 82 are patterned so as to form the island-like electrode 82 covered with the ZnS layer 83.

Next, an insulator layer 84 is formed on the ZnS layer 83 and the glass substrate 81 using a photosensitive resin. By spin coating, the photosensitive resin is applied on the entire surface of the ZnS layer 83 so as to have a thickness of about 300 nm. After exposure using a photomask, development is performed using a prescribed developer, so as to form the insulator layer 84 having through-holes 84a and 84b. The through-hole 84a is to be used for connecting the ZnS layer 83 and the protrusion 85a of the pixel electrode 85. The through-hole 84b is to be used for connecting the ZnS layer 83 and the protrusion 86a of the scanning line 86.

Next, an Al layer is deposited on the substrate 87 by sputtering so as to have a thickness of about 300 nm. The pixel electrode 85 and the scanning line 86 are formed by patterning the Al layer by using a photolithography process and an etching process. The etching process may use hydrogen bromide acid.

Fabrication processes for a counter substrate and a liquid crystal layer are the same as the first and second examples.

In this example, the ZnS devices are connected in series to form a switching element having a back-to-back structure, whereby the symmetrical property in the I–V characteristic of the switching element with respect to the polarity of an voltage applied to the switching element is improved. Alternatively, the ZnS devices are connected in parallel so as to form a ring structure in order to improve the symmetrical property in the I–V characteristic.

In addition, the impurity to be implanted into the ZnS layer may be another transition metal element such as Fe instead of Ni.

Example 4

In Example 4, a transmission type LCD apparatus using the ZnS device is described.

FIG. 9A shows a plan view showing portion of a substrate 98 with the ZnS device of the LCD apparatus in the forth example of the present invention. FIG. 9B shows the cross section taken along the line D–D' in FIG. 9A. The ZnS device 97 includes, on a glass substrate 91, a first electrode 92a (forming a portion of a scanning line 92) of tantalum (Ta), a ZnS layer (non-linear resistive layer) 93 containing Ni, and a second electrode (upper electrode) 96 of Al. The upper electrode 96 is connected to a pixel electrode 95 of ITO. Preferably, a thickness of the ZnS layer is 100 nm.

As shown in FIGS. 9A and 9B, a conductive layer of Ta is formed on the glass substrate 91 with the thickness of 300 nm by sputtering, and the scanning line 92 is formed by patterning the conductive layer on the glass substrate 91.

Next, an insulator layer 94 is formed on the glass substrate 91 covering the scanning line 92. In this example, an acrylic acid positive-type photosensitive resin is used to form the insulating layer 94. By spinner coating, the photosensitive resin is applied on the entire surface of the glass substrate 91 so as to have a thickness of about 400 nm. The formation of the insulator layer 94 using the photosensitive resin has an advantage that the process can be simplified as compared with other methods for forming an insulating layer. As the photosensitive resin, alternatively, for example, polyimide, polyamide, polymethyl methacrylate, and the like may be used. After exposure using a photomask, development is performed using a prescribed developer, so as to form the insulator layer 94 having a throughhole 94a.

Next, the ZnS layer 93 is formed on the insulator layer 94 by sputtering using a sintered ZnS target including Ni. The ZnS layer 93 is formed with a thickness of 100 nm. The ZnS layer 93 is connected to the scanning line 92 via the through-hole 94a.

Next, an Al layer is deposited by sputtering so as to have a thickness of about 300 nm, and then the photolithography process is performed. Thereafter, the patterning is performed by wet etching by using a phosphoric acid, or a mixed acid of phosphoric acid, nitric acid, and acetic acid, to form the upper electrode 96 covering the ZnS layer 93, as shown in FIG. 9B.

Then, an ITO layer is deposited by sputtering so as to have a thickness of about 200 nm, and the pixel electrode 95 is patterned so as to connect to the upper electrode 96 as shown in FIGS. 9A and 9B.

Fabrication processes for a counter substrate and a liquid crystal layer are similar to that of the first example. In this example of the transmission type LCD, a twisted nematic type liquid crystal material is used as a display medium and polarizers are attached to the substrates.

Another transition metal element such as Fe instead of Ni may be implanted into the ZnS layer 93, by using a sintered ZnS target including the transition metal element.

Example 5

In Example 5, a ZnS device includes ZnS layer including iron and nickel as impurities. In this example, an LCD apparatus using the ZnS device is a reflection type White-Taylor guest-host LCD apparatus which is the same as Example 2.

After a scanning line and an insulator layer are formed on the glass substrate in a similar manner as in Example 2, a ZnS layer is formed by sputtering using a sintered ZnS target including Ni and Fe. The ZnS layer has a thickness of about 100 nm. A quantitative analysis using a flameless atomic absorption spectrometry confirms that the Ni content and Fe content of the ZnS layer are 1 mg per 1 g of ZnS, respectively. A pixel electrode is formed by patterning an Al layer in a same manner as Example 2.

Fabrication processes of a counter substrate and a liquid crystal layer are similar to that of the second example.

Figure 10:
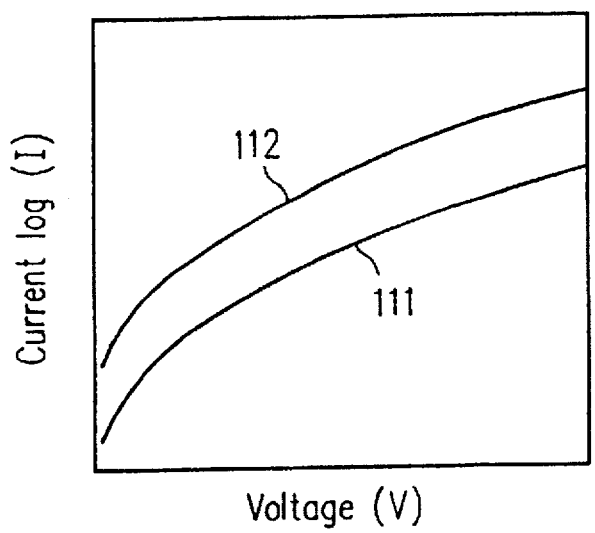
FIG. 10 is a diagram showing the I–V characteristic of the ZnS device having the ZnS layer in which Fe and Ni are implanted.

FIG. 10 shows the I-V characteristic of the ZnS device in Example 5 having the ZnS layer in which Fe and Ni are implanted. In FIG. 10, curve 111 shows the I-V characteristic of the ZnS device of Example 2 with the ZnS layer containing 1 mg of Fe per 1 g of ZnS. A curve 112 shows the I-V characteristic of the ZnS device of this example with the ZnS layer containing 1 mg of Fe and 1 mg of Ni per 1 g of ZnS. As shown in FIG. 10, an ON-current can be increased by adding Ni to the ZnS layer while the I-V characteristic retains the steepness.

By implanting Fe and Ni and controlling the content ratio thereof, the steepness of the I-V characteristic (i.e. non-linearity) and the ON-current of the ZnS device is suitably adjusted to the characteristic of the display medium. This make it possible to realize the display apparatus for providing a display with a high quality.

Example 6

In previous examples, the ZnS layer of the ZnS device is formed by sputtering using a sintered ZnS target including transition metal element(s). In this example, the ZnS layer is formed using a sintered ZnS target including transition metal sulfide instead of the transition metal element.

A transition metal element included in the sintered ZnS target is prone to oxidizing due to remaining gas in the chamber during the sputtering process. The resulting transition metal oxide is implanted in the ZnS layer and causes undesirable effects on the I-V characteristic of the ZnS device. Controlling the remaining gas is difficult so that the I-V characteristic of ZnS devices may vary even if they are produced in the same process.

Figure 11:
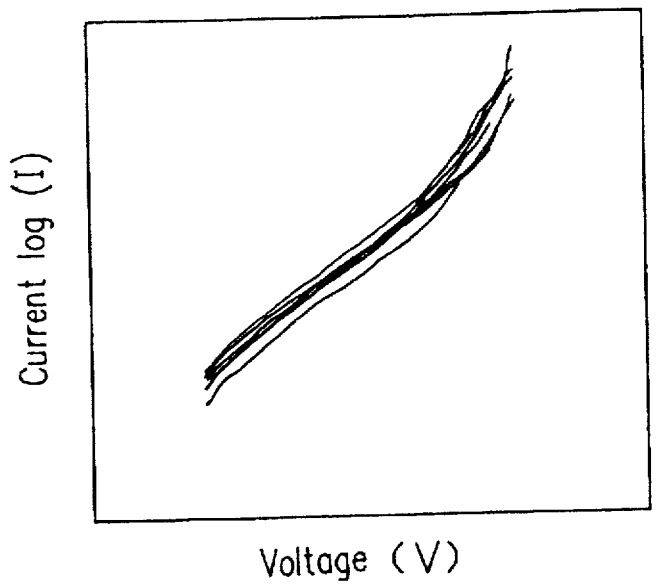
FIG. 11 is a diagram showing the I–V characteristic variation of a plurality of ZnS devices which are formed using a ZnS target including the transition metal element.

FIG. 11 shows the I-V characteristic of a plurality of ZnS devices for pixel electrodes formed on an active matrix substrate of an LCD device. As shown in FIG. 11, the I-V characteristic varies among the ZnS devices on the same active matrix substrate. The I-V characteristic variations of the ZnS devices formed on the active matrix substrate degrade the quality of the display apparatus.

In order to avoid the above mentioned problem, the ZnS target including transition metal sulfide is used in the sputtering process in this example. The transition metal sulfide is made by sulfurizing the transition metal element to be contained in the zinc sulfide layer. The transition metal sulfide in the ZnS target is less oxidizable than the transition metal element in the ZnS target. This reduces the I-V characteristic variations among the ZnS devices on the substrate.

Figure 12:
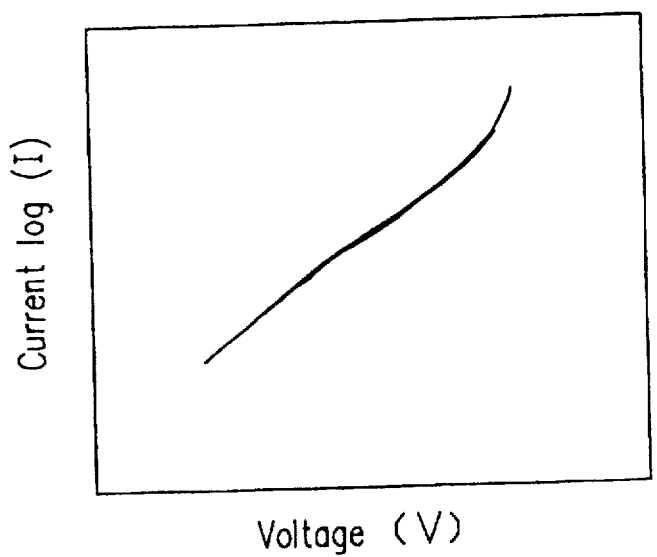
FIG. 12 is a diagram showing the I–V characteristic variation of a plurality of ZnS devices which are formed using a ZnS target including the transition metal sulfide.

FIG. 12 shows the I-V characteristic of a plurality of ZnS devices formed by using the ZnS target including the transition metal sulfide. As shown in FIG. 12, the I-V characteristic variations among the ZnS devices are very small so that a display quality of the display apparatus can be improved.

The transition metal sulfide is not limited to nickel sulfide. Iron sulfide or a mixture of nickel sulfide and iron sulfide may be added to the ZnS target.

Hereinafter, the process of producing the ZnS device by using the ZnS target including the transition metal sulfide and a display apparatus using the ZnS device of the present invention will be described.

Example 7

In Example 7, a reflection type White-Taylor guest-host LCD apparatus using the ZnS device is described. The LCD apparatus is similar to that described in Example 1.

Figure 13A:
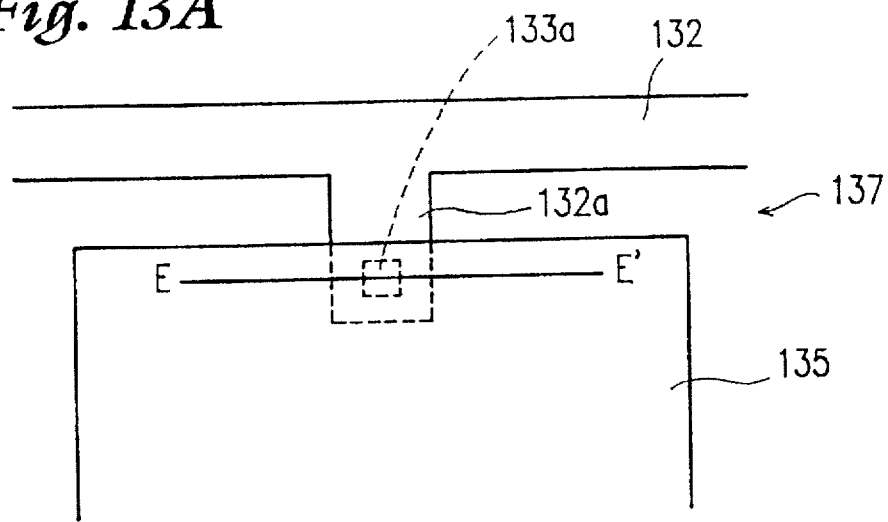
FIG. 13A is a plan view showing a portion of a substrate with the ZnS device of the LCD apparatus in another example of the present invention.
Figure 13B:
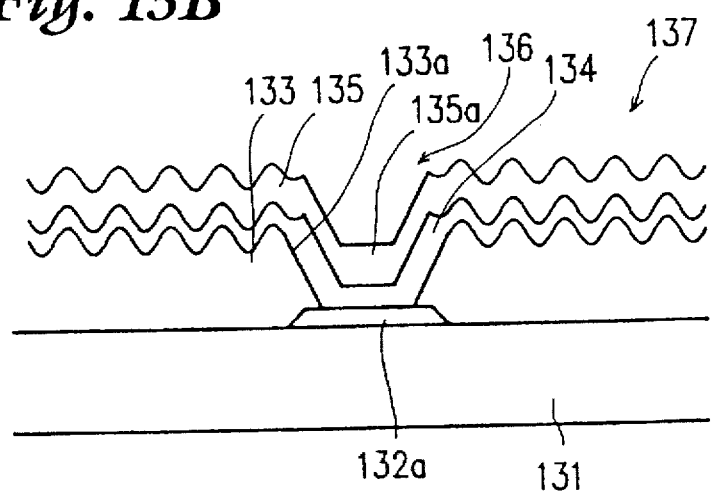
FIG. 13B is a cross-sectional view taken along the line E–E' in FIG. 13A.

FIG. 13A is a plan view showing a portion of a substrate 137 with the ZnS device of the LCD apparatus in this example of the present invention. FIG. 13B shows the cross section taken along the line E-E' in FIG. 13A. The ZnS device 136 includes, on a glass substrate 131, a first electrode 132a (forming a portion of a scanning line 132) of tantalum (Ta), a ZnS layer (non-linear resistive layer) 134, and a second electrode 135a which is a portion of a pixel electrode 135 of aluminum (Al). Preferably, a thickness of the ZnS layer is 100 nm and the Ni content of the ZnS layer is 3 mg per 1 g of ZnS (i.e. 0.3 wt %).

As shown in FIGS. 13A and 13B, the scanning line 132 is formed on the glass substrate 131 by patterning a conductive layer of Ta formed on the glass substrate 131 with a thickness of 200 nm by sputtering. Next, an insulator layer 133 is formed on the glass substrate 131. The insulating layer is formed as follows. By spinner coating, an acrylic acid positive-type photosensitive resin is applied on the entire surface of the glass substrate 131. The photosensitive resin has a thickness of about 1.4 µm. Using a photosensitive resin can make patterning processes simple. After the exposure using a photomask, development is performed using a prescribed developer, so as to form the insulator layer 133 having through-hole 133a. The through-hole 133a is used for connecting the ZnS layer 134 and the scanning line 132.

Next, the surface of the insulator layer 133 is corrugated by a reactive ion etching (RIE) process. The corrugated surface has about 700 nm of unevenness which improves the reflection characteristic of the pixel electrode.

Next, the ZnS layer 134 is formed on the substrate 137 by sputtering using a sintered ZnS target including nickel sulfide (NiS$_2$) so as to cover the scanning line 132 and the insulator layer 133 The ZnS layer has a thickness of about 100 nm. A quantitative analysis using a flameless atomic absorption spectrometry confirms that the Ni content of the ZnS layer is 3 mg per 1 g of ZnS. Next, an Al layer is deposited on the substrate 137 by sputtering so as to have a thickness of about 200 nm, and then a photolithography process and an etching process are performed so as to form the pixel electrode 135. The portion 135a of the pixel electrode 135 corresponding to the through-hole 133a serves as the second electrode of the ZnS device 136.

Fabrication processes for a counter substrate and a liquid crystal layer are similar to that of the previous examples.

By using the ZnS target including nickel sulfide, the I–V characteristic variation among the ZnS devices of the LCD apparatus can be reduced. This makes it possible that the LCD apparatus provides a display exhibiting high quality.

Example 8

In Example 8, a reflection type White-Taylor guest-host LCD apparatus using the ZnS device is described. The ZnS layer of the ZnS device includes iron as an impurity. The LCD apparatus is similar to that described in Example 2.

Figure 14A:
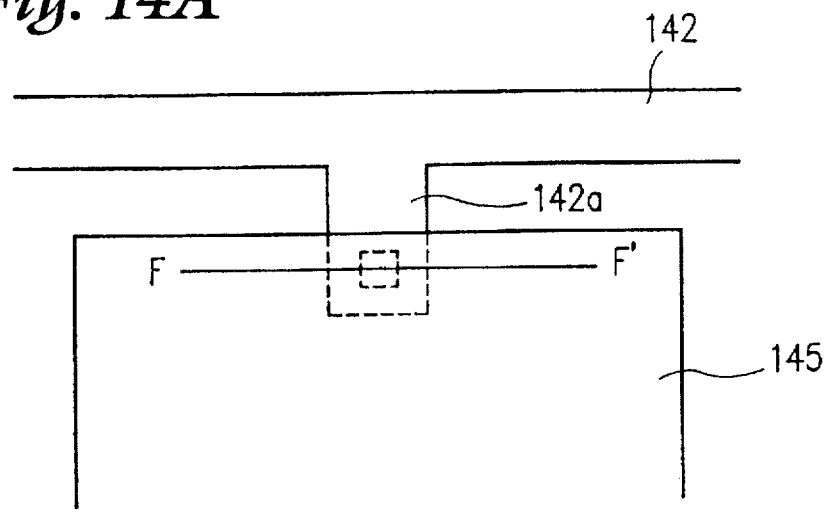
FIG. 14A is a plan view showing a portion of a substrate with the ZnS device of the LCD apparatus in another example of the present invention.
Figure 14B:
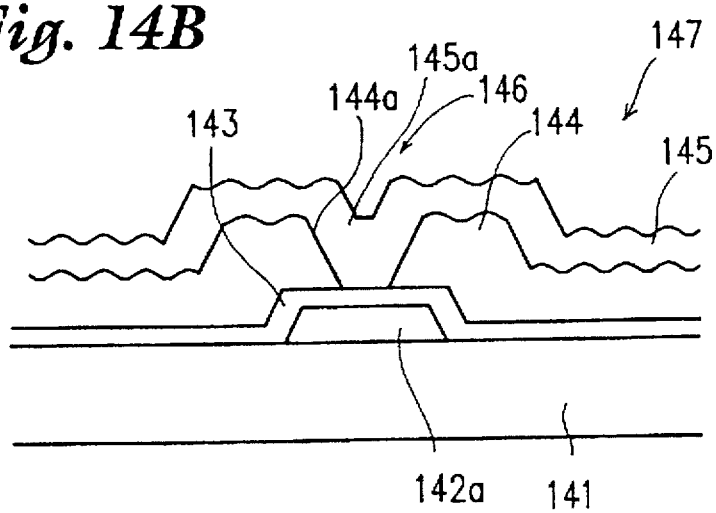
FIG. 14B is a cross-sectional view taken along the line F–F' in FIG. 14A.

FIG. 14A shows a plan view showing a portion of a substrate 147 with the ZnS device of the LCD apparatus in the second example of the present invention. FIG. 14B shows the cross section taken along the line F–F' in FIG. 14A. The ZnS device 146 includes, on a glass substrate 141, a first electrode 142a (forming a portion of a scanning line 142) of tantalum (Ta), a ZnS layer (non-linear resistive layer) 143, and a second electrode 145a which is a portion of a pixel electrode 145 of aluminum (Al). Preferably, a thickness of the ZnS layer is 80 nm and the Fe content of the ZnS layer is 5 mg per 1 g of ZnS (0.5 wt %).

As shown in FIGS. 14A and 14B, a conductive layer of Ta is formed on the glass substrate 141 with a thickness of 200 nm by sputtering, and the scanning line 142 is formed by patterning the conductive layer on the glass substrate 141. Next, the ZnS layer 143 is formed on the glass substrate 141 by sputtering using a sintered ZnS target including iron sulfide (FeS, Fe$_2$S$_3$), so as to cover the scanning line 142. The ZnS layer 143 has a thickness of about 80 nm. A quantitative analysis using a flameless atomic absorption spectrometry confirms that the Fe content of the ZnS layer 143 is 5 mg per 1 g of ZnS.

Next, an insulator layer 144 is formed on the ZnS layer 143. In this example, an acrylic acid positive-type photosensitive resin is used to form the insulating layer 144. Using a photosensitive resin can make patterning processes simple. By spinner coating, the photosensitive resin is applied on the entire surface of the ZnS layer 143 so as to have a thickness of about 1.4 µm. After exposure using a photomask, development is performed using a prescribed developer, so as to form the insulator layer 144 having a through-hole 144a. The through-hole 144a is used for connecting the ZnS layer 143 and the second electrode 145a. Thereafter, the surface of the insulator layer 144 is corrugated by RIE process.

Next, an Al layer is deposited on the substrate 147 by sputtering so as to have a thickness of about 200 nm. Then photo-lithography and etching processes are performed so as to form the pixel electrode 145. The portion 145 of the pixel electrode 145 corresponding to the through-hole 144a serve as the second electrode of the ZnS device 146.

Fabrication processes for a counter substrate and a liquid crystal layer are the same as the first example.

By using the ZnS target including iron sulfide, the I–V characteristic variation among the ZnS devices of the LCD apparatus can be reduced. This makes it possible that the LCD apparatus provide a display exhibiting a high quality.

Example 9

In Example 9, an LCD apparatus using a pair of the ZnS devices which are connected in series to form a back-to-back structure is described. The LCD apparatus is similar to that described in Example 3.

Figure 15A:
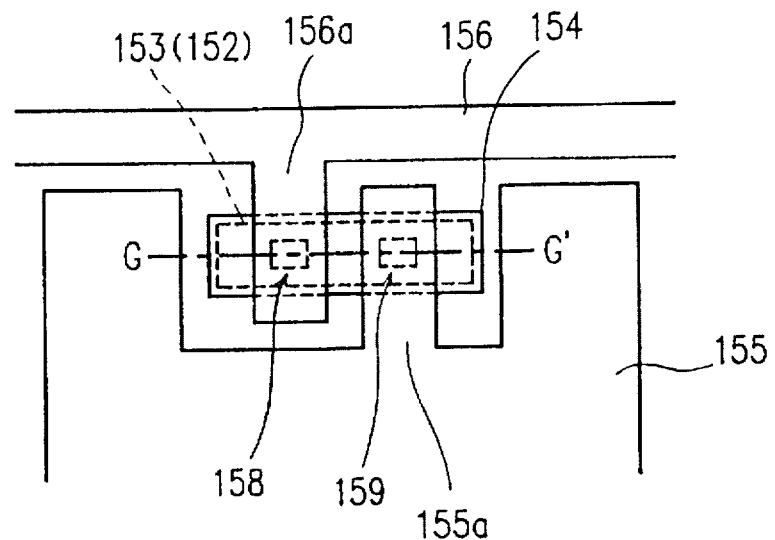
FIG. 15A is a plan view showing a portion of a substrate with the ZnS device of the LCD apparatus in another example of the present invention.
Figure 15B:
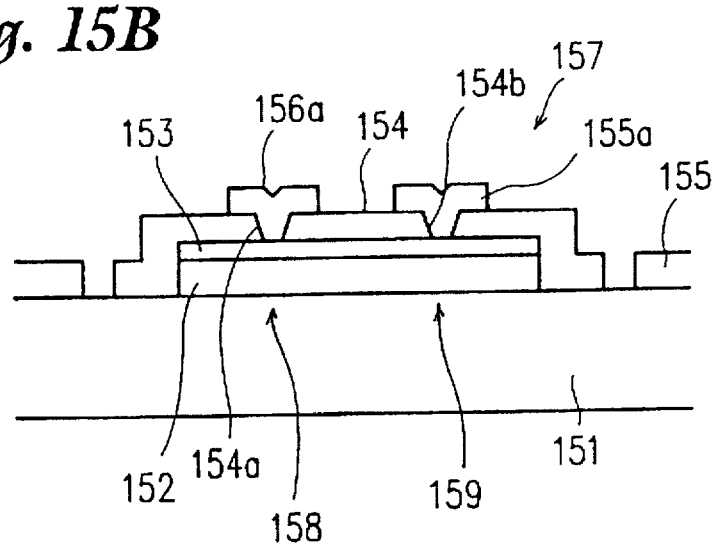
FIG. 15B is a cross-sectional view taken along the line G–G' in FIG. 15A.

FIG. 15A is a plan view showing a portion of a substrate 157 with the ZnS devices in the LCD apparatus in Example 9. FIG. 15B shows a cross section taken along the line G–G' in FIG. 15A.

As shown in FIGS. 15A and 15B, in the substrate 157, a pixel electrode 155 formed of Al, a scanning line 156 formed of Al, and a pair of the ZnS devices are formed on a glass substrate 151. The pixel electrode 155 includes a protrusion 155a extending toward the scanning line 156, and the scanning line 156 includes a protrusion 156a extending toward the pixel electrode 155. Under the protrusions 155a and 156a, an island-like electrode 152 made of Ta is formed on the glass substrate 151. A ZnS layer 153 containing Ni is formed on the island-like electrode 152. An insulator layer 154 is formed so as to cover the entire ZnS layer 153. The insulator layer 154 has through-holes 154a and 154b. The protrusion 155a of the pixel electrode 155 is connected to the ZnS layer 153 via the through-hole 154a, and the protrusion 156a of the scanning line 156 is connected to the ZnS layer 153 via the through-hole 154b.

The LCD apparatus having the above construction includes a first ZnS device 158 and a second ZnS device 159. The first ZnS device 158 has an MSM three-layer structure in the through-hole 154b. The MSM structure of the first ZnS device 158 includes the protrusion 156a of the scanning line 156, the ZnS layer 153, and the island-like electrode 152. The second ZnS device 159 also has an MSM three-layer structure in the through-hole 154a including the island-like electrode 152, the ZnS layer 153, and the protrusion 155a of the pixel electrode 155. The first and second ZnS devices 158 and 159 are coupled in series at opposite polarities, so as to form a back-to-back structure.

Next, the production process of the LCD apparatus having the above-described construction will be described with reference to FIGS. 15A and 15B.

First, a conductive layer of Ta for making up the island-like electrode 152 is formed on the glass substrate 151 by sputtering so as to have a thickness of about 300 nm. Next, the ZnS layer 153 is formed on the glass substrate 151 by sputtering using a sintered ZnS target including NiS, so as to cover the electrode 152. The ZnS layer 153 is formed with a thickness of 80 nm and containing 500 µg of Ni per 1 g of ZnS. The ZnS layer 153 and the electrode 152 are patterned so as to form the island-like electrode 152 covered with the ZnS layer 153.

Next, an insulator layer 154 is formed on the ZnS layer 153 and the glass substrate 151 using a photosensitive resin. By spin coating, the photosensitive resin is applied on the entire surface of the ZnS layer 153 so as to have a thickness of about 300 nm. After exposure using a photomask, development is performed using a prescribed developer, so as to form the insulator layer 154 having through-holes 154a and 154b. The through-hole 154a is to be used for connecting the ZnS layer 153 and the protrusion 155a of the pixel electrode 155. The through-hole 154b is to be used for connecting the ZnS layer 153 and the protrusion 156a of the scanning line 156.

Next, an Al layer is deposited on the substrate 157 by sputtering so as to have a thickness of about 300 nm. The pixel electrode 155 and the scanning line 156 are formed by patterning the Al layer by using a photo-lithography process and an etching process. The etching process may use hydrogen bromide acid.

Fabrication processes for a counter substrate and a liquid crystal layer are the same as the first and the second example.

By using the ZnS target including nickel sulfide, the I–V characteristic variation among the ZnS devices of the LCD apparatus can be reduced. Furthermore, in this example, the ZnS devices are connected in series to form a switching element having a back-to-back structure, whereby the symmetrical property in the I–V characteristic of the switching element with respect to the polarity of an voltage applied to the switching element is improved. This makes it possible that the LCD apparatus performs a display with a high quality.

Alternatively, the ZnS devices are connected in parallel so as to form a ring structure in order to improve the symmetrical property in the I–V characteristic. In addition, the impurity to be implanted into the ZnS layer may be another transition metal element such as Fe instead of Ni.

Example 10

In Example 10, a transmission type LCD apparatus using the ZnS device is described. The LCD apparatus is similar to that described in Example 4.

Figure 16A:
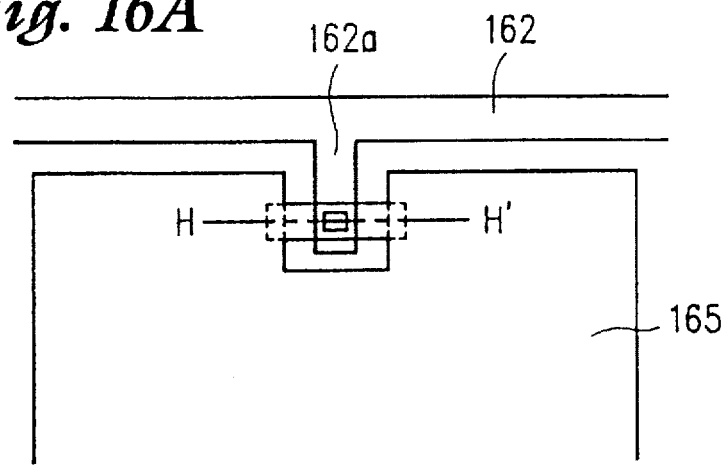
FIG. 16A is a plan view showing a portion of a substrate with the ZnS device of the LCD apparatus in another example of the present invention.
Figure 16B:
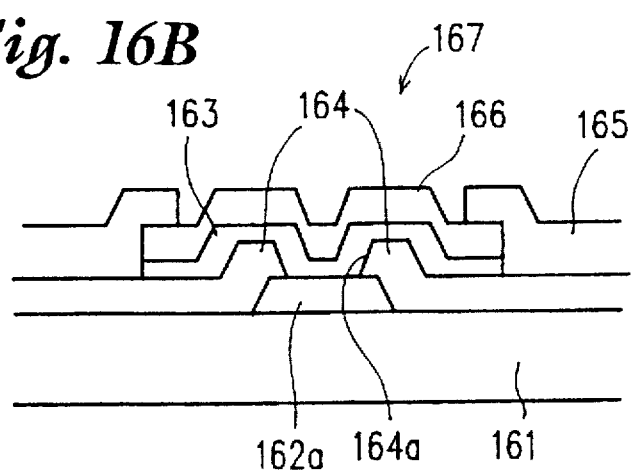
FIG. 16B is a cross-sectional view taken along the line H–H' in FIG. 16A.

FIG. 16A shows a plan view showing a portion of a substrate 168 with the ZnS device of the LCD apparatus in the forth example of the present invention. FIG. 16B shows the cross section taken along the line H–H' in FIG. 16A. The ZnS device 167 includes, on a glass substrate 161, a first electrode 162a (forming a portion of a scanning line 162) of tantalum (Ta), a ZnS layer (non-linear resistive layer) 163 containing Ni, and a second electrode (upper electrode) 166 of Al. The upper electrode 166 is connected to a pixel electrode 165 of ITO. Preferably, a thickness of the ZnS layer is 100 nm.

As shown in FIGS. 16A and 16B, a conductive layer of Ta is formed on the glass substrate 161 with the thickness of 300 nm by sputtering, and the scanning line 162 is formed by patterning the conductive layer on the glass substrate 161.

Next, an insulator layer 164 is formed on the glass substrate 161 covering the scanning line 162. In this example, an acrylic acid positive-type photosensitive resin is used to form the insulating layer 164. By spinner coating, the photosensitive resin is applied on the entire surface of the glass substrate 161 so as to have a thickness of about 400 nm. The formation of the insulator layer 164 using the photosensitive resin has an advantage that the process can be simplified as compared with other methods for forming an insulating layer. As the photosensitive resin, alternatively, for example, polyimide, polyamide, polymethyl methacrylate, and the like may be used. After exposure using a photomask, development is performed using a prescribed developer, so as to form the insulator layer 164 having a through-hole 164a.

Next, the ZnS layer 163 is formed on the insulator layer 164 by sputtering using a sintered ZnS target including NiS. The ZnS layer 163 is formed with a thickness of 100 nm. The ZnS layer 163 is connected to the scanning line 162 via the through-hole 164a.

Next, an Al layer is deposited by sputtering so as to have a thickness of about 300 nm, and then the photolithography process is performed. Thereafter, the patterning is performed by wet etching by using a phosphoric acid, or a mixed acid of phosphoric acid, nitric acid, and acetic acid, to form the upper electrode 166 covering the ZnS layer 163, as shown in FIG. 16B.

Then, an ITO layer is deposited by sputtering so as to have a thickness of about 200 nm, and the pixel electrode 165 is patterned so as to connect to the upper electrode 166 as shown in FIGS. 16A and 16B.

Fabrication processes for a counter substrate and a liquid crystal layer are similar to that of the first example. In this example of the transmission type LCD, a twisted nematic liquid crystal material is used as a display medium and polarizers are attached to the substrates.

By using the ZnS target including nickel sulfide, the I–V characteristic variation among the ZnS devices of the LCD apparatus can be reduced. Another transition metal element such as Fe instead of Ni may be implanted into the ZnS layer 163, by using a sintered ZnS target including the transition metal sulfide.

Example 11

In Example 11, a ZnS device includes ZnS layer including iron and nickel as impurities. In this example, an LCD apparatus using the ZnS device is a reflection type White-Taylor guest-host LCD apparatus which is the same as Example 2, 5, or 8.

After a scanning line and an insulator layer are formed on the glass substrate in a similar manner as in Example 2, a ZnS layer by sputtering using a sintered ZnS target including nickel sulfide and iron sulfide. The ZnS layer is formed with a thickness of about 100 nm. A quantitative analysis using a flameless atomic absorption spectrometry confirms that the Ni content and Fe content of the ZnS layer are 1 mg per 1 g of ZnS, respectively. A pixel electrode is formed by patterning an Al layer in a same manner as Example 2.

Fabrication processes a counter substrate and a liquid crystal layer are similar to that of the second example.

Figure 17:
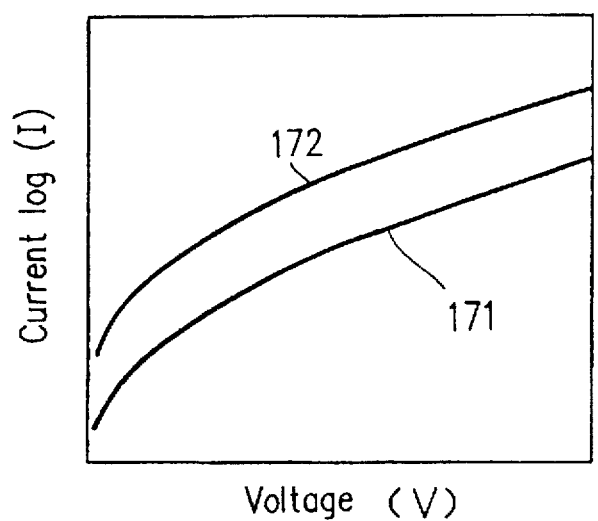
FIG. 17 is a diagram showing the I–V characteristic of the ZnS device having the ZnS layer in which Fe and Ni are implanted.
Figure 18A:
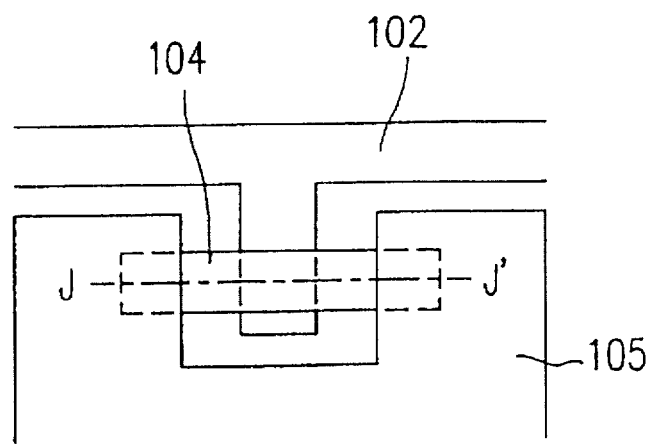
FIG. 18A is a plan view showing a two-terminal device portion corresponding to one pixel in a conventional LCD apparatus.
Figure 18B:
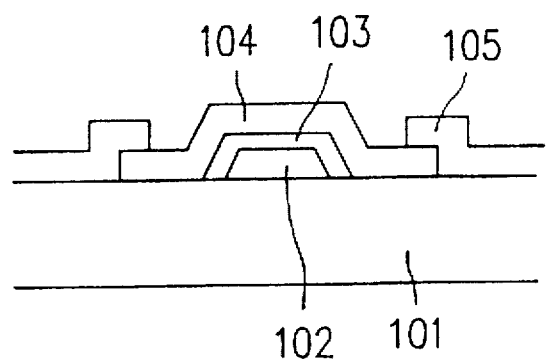
FIG. 18B is a cross-sectional view taken along the line J–J' in FIG. 18A.

FIG. 17 shows the I–V characteristic of the ZnS device in Example 5 having the ZnS layer in which Fe and Ni are implanted. In FIG. 17, a curve 171 shows the I–V characteristic of the ZnS device of Example 8 with the ZnS layer containing 1 mg of Fe per 1 g of ZnS. Curve 172 shows the I–V characteristic of the ZnS device of this example with the ZnS layer containing 1 mg of Fe and 1 mg of Ni per 1 g of ZnS. As shown in FIG. 17, an ON-current can be increased by adding Ni to the ZnS layer while the I–V characteristic retains the steepness.

By using the ZnS target including iron sulfide and nickel sulfide, the I–V characteristic variation among the ZnS devices of the LCD apparatus can be reduced. In addition, by implanting Fe and Ni and controlling the content ratio thereof, the steepness of the I–V characteristic (i.e. non-linearity) and the ON-current of the ZnS device is suitably adjusted to the characteristic of the display medium. This make it possible to realize a high quality display apparatus.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A two-terminal non-linear resistive device including:
   a first conductive electrode, a second conductive electrode, and a non-linear resistive zinc sulfide layer interposed between and in contact with the first conductive electrode and the second conductive electrode, wherein the zinc sulfide layer contains at least one transition metal element as an impurity and the transition metal element is nickel or iron, and wherein the zinc sulfide layer includes at least one of 10 μg to 20 mg of Ni and 10 μg to 20 mg of FE per 1 g of zinc sulfide.

2. A two-terminal non-linear resistive device used as a switching element in a display apparatus including a first substrate; a second substrate; a display medium interposed between the first and second substrates; a pixel electrode disposed on the first substrate for allowing the display medium to perform a display based on an applied voltage, the switching element being connected to the pixel electrode for applying the voltage for the display to the pixel electrode in accordance with a received driving signal; and a bus line for supplying the driving signal to the switching element, said two-terminal device comprising:

a first conductive electrode for receiving the driving signal;

a zinc sulfide layer electrically connected to the first electrode; and a second conductive electrode electrically connected to the zinc sulfide layer and electrically connected to the pixel electrode, wherein said zinc sulfide layer is interposed between the first and second electrodes and includes at least one transition metal element selected from a group consisting of Ni and Fe as an impurity, and wherein the zinc sulfide layer includes at least one of 10 μg to 20 mg of Ni and 10 μg to 20 mg of Fe per 1 g of zinc sulfide.

3. A method for producing a two-terminal non-linear resistive device including a first and a second electrode and a zinc sulfide layer interposed therebetween, the zinc sulfide layer containing at least one transition metal element as an impurity wherein the transition metal element is nickel or iron, and wherein the zinc sulfide layer is formed on the first electrode by sputtering a sintered ZnS target which includes at least one transition metal sulfide which is made by sulfurizing said at least one transition metal element to be contained in the zinc sulfide layer.

4. A method of producing a two-terminal non-linear resistive device according to claim 3, wherein said sintered ZnS target includes at least one of Nickel sulfide and Iron sulfide.

5. A method for producing a two-terminal non-linear resistive device including a first and a second electrode and a zinc sulfide layer interposed therebetween, the zinc sulfide layer containing at least one transition metal element as an impurity and the transition metal element is nickel or iron, comprising the steps of:

(a) forming the first electrode by patterning a first conductor on a substrate;

(b) forming the zinc sulfide layer on the first electrode by sputtering a sintered ZnS target; and (c) forming a second electrode by patterning a second conductor on the zinc sulfide layer, wherein said sintered ZnS target used in step (b) includes at least one transition metal sulfide which is made by sulfurizing said at least one transition metal element to be contained in the zinc sulfide layer.

6. A method of producing a two-terminal non-linear resistive device according to claim 5, wherein said sintered ZnS target includes at least one of Nickel sulfide and Iron sulfide.

7. A method of producing a two-terminal non-linear resistive device according to claim 6, wherein step (b) is performed so that the zinc sulfide layer includes at least one of 10 μg to 20 mg of Ni and 10 μg to 20 mg of Fe per 1 g of zinc sulfide.

8. A display apparatus including:

a first substrate;

a second substrate;

a display medium interposed between the first and second substrates;

a pixel electrode disposed on the first substrate for allowing the display medium to perform a display based on an applied voltage;

a switching element connected to the pixel electrode for applying the voltage for the display to the pixel electrode in accordance with a received driving signal; and a bus line for supplying the driving signal to the switching element, wherein said switching element includes a two-terminal device comprising: a first conductive electrode for receiving the driving signal; a zinc sulfide layer electrically connected to the first electrode; and a second conductive electrode electrically connected to the zinc sulfide layer and electrically connected to the pixel electrode, wherein said zinc sulfide layer is interposed between the first and second electrodes and includes at least one transition metal element selected from a group consisting of Ni and Fe as an impurity, and wherein the zinc sulfide layer includes at least one of 10 μg to 20 mg of Ni and 10 μg to 20 mg of Fe per 1 g of zinc sulfide.

9. A method for using a two-terminal non-linear resistive device as a switching element in a display apparatus, the two-terminal non-linear resistive device including:

a first conductive electrode;

a second conductive electrode; and a zinc sulfide layer interposed between and in contact with the first electrode and the second electrode, the zinc sulfide layer including at least one transition metal element selected from a group consisting of Ni and Fe as an impurity, and the display apparatus including:

a first substrate;

a second substrate;

a display medium interposed between the first and second substrates;

a pixel electrode disposed on the first substrate for allowing the display medium to perform a display based on an applied voltage, the switching element being connected to the pixel electrode for applying the voltage for the display to the pixel electrode in accordance with a received driving signal; and a bus line for supplying the driving signal to the switching element, wherein the first electrode is electrically connected to the bus line for receiving the driving signal, the zinc sulfide layer is electrically connected to the first electrode, the second electrode is electrically connected to the zinc sulfide layer and to the pixel electrode, and wherein the zinc sulfide layer includes at least one of 10 μg of 20 mg of Ni and 10 μg to 20 mg of Fe per 1 g of zinc sulfide.

* * * * *